United States Patent [19]

Monticelli

[11] 4,451,801

[45] May 29, 1984

[54] WIDEBAND LINEAR CARRIER CURRENT AMPLIFIER

[75] Inventor: Dennis M. Monticelli, Fremont, Calif.

[73] Assignee: National Semiconductor Corporation, Santa Clara, Calif.

[21] Appl. No.: 295,905

[22] Filed: Aug. 24, 1981

[51] Int. Cl.³ .................. H03F 3/20; H04M 11/04
[52] U.S. Cl. ......................... 330/278; 340/310 R; 330/129
[58] Field of Search .............. 330/129, 278, 294, 279; 340/310 A, 310 R

[56] References Cited

U.S. PATENT DOCUMENTS

| | | | |
|---|---|---|---|
| 4,205,276 | 5/1980 | Wright et al. | 330/294 |
| 4,267,518 | 5/1981 | Davis | 330/278 |
| 4,305,044 | 12/1981 | Leidich | 330/278 |

*Primary Examiner*—James B. Mullins
*Assistant Examiner*—G. Wan
*Attorney, Agent, or Firm*—Gail W. Woodward; Paul J. Winters; Michael J. Pollock

[57] ABSTRACT

An amplifier suitable for carrier current line driver applications is shown. It includes a triangle wave to sine wave shaper circuit and an automatic level control. It incorporates a line surge arrestor circuit that is active even when the transmitting capability is disabled. The circuit is shown in an integrated circuit form, the output of which is capable of being boosted by off-chip components.

9 Claims, 2 Drawing Figures

WIDEBAND LINEAR CARRIER CURRENT AMPLIFIER

BACKGROUND OF THE INVENTION

The invention relates to carrier current transmitters, which are designed to operate into an AC power line. The circuit is designed to accept a triangle wave signal as described in relation with my copending patent application titled "Low Temperature Coefficient Wide Bandwidth Voltage Controlled Oscillator," Ser. No. 289,334, filed Aug. 3, 1981. This application is incorporated herein by reference. This oscillator develops a signal at a frequency that is voltage controlled over a relatively wide range that includes the most desired carrier current bands. Since the power line presents a complex impedance, such transmitters must be capable of supplying substantial power into resistive and/or reactive loads of great variability.

SUMMARY OF THE INVENTION

It is an object of the invention to provide an amplifier capable of supplying 300 kHz signal to an AC power line with good efficiency.

It is a further object of the invention to provide an amplifier that has a current output, so as to be short-circuit protected and capable of driving a load of virtually any impedance.

It is still a further object of the invention provide an amplifier capable of driving an AC power line, and including an active power line surge arrestor that is active even when the amplifier is turned off.

These and other objects are achieved in an integrated circuit configured as follows: A current amplifier is coupled to drive a tuned circuit load that is coupled to the AC power line. The output stage includes a zener diode actuated surge arrestor that produces output transistor conduction when a line surge is present that exceeds the zener voltage. The current amplifier is driven by an automatic level control driver that senses the output signal and adjusts the drive when the output exceeds a predetermined threshold. The automatic level control is current-driven from a shaper circuit that accepts a triangular wave input and produces a sine-wave current drive. Means are provided for disabling the transmitter signal without impairing the surge arrestor action, and for boosting the output signal capability with off-chip components.

DESCRIPTION OF THE INVENTION

Figure 1:
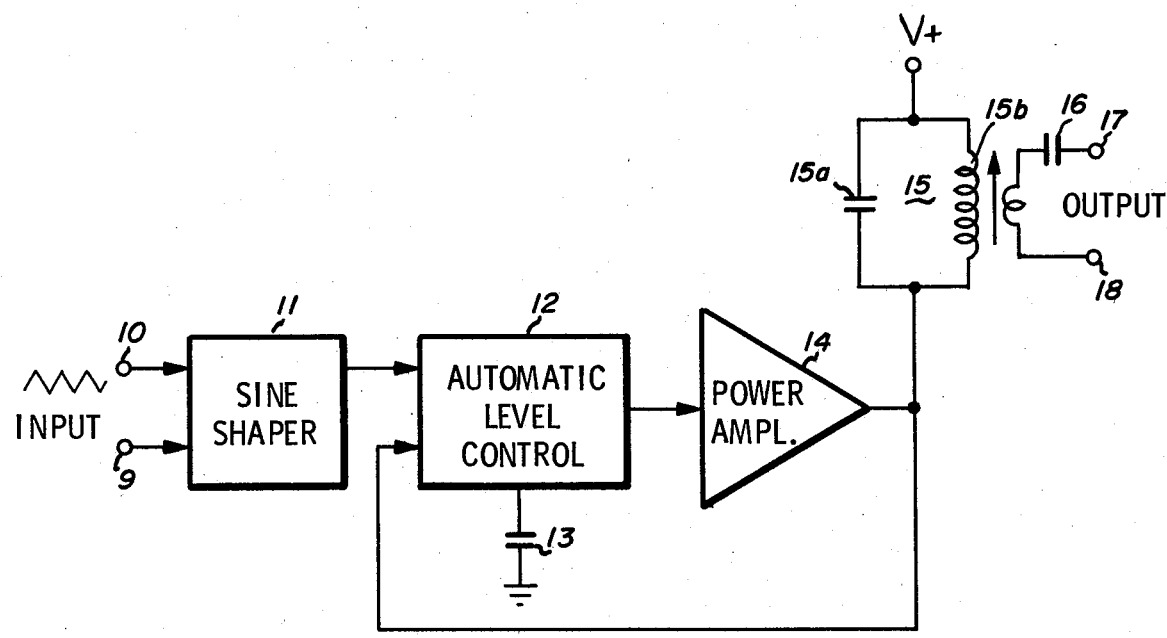
FIG. 1 is a block diagram of the circuit of the invention.

FIG. 1 is a block diagram of the transmitter of the invention. The input is a triangular wave signal applied between terminals 9 and 10. When this signal is passed through shaper stage 11, it produces a sine wave. The thus produced sine wave signal is applied to one input of an automatic level control (ALC) circuit 12 which drives power amplifier 14. Tank circuit 15 is excited by power amplifier 14 so as to produce a sine wave power output signal at terminals 17 and 18 which represent the transmitter output. Capacitor 16 is chosen to have low impedance at the carrier frequency, but relatively high impedance at DC and the lower-power line frequencies (60 Hz). Therefore, terminals 17 and 18 can be connected to the power lines to provide a carrier current communications system. The ALC 12 has a second input obtained from the output signal across tank 15. A capacitor 13 is charged in proportion to the output peak signal and acts to reduce the signal transmitted through ALC 12. This creates a negative feedback loop that acts to maintain the desired output voltage, relatively independent of the power line signal loading. Full power is applied to the line only when load conditions warrant it; power is not wasted.

In effect, under typical conditions, power amplifier 14 operates in class A and supplies output power at about 35% efficiency.

The circuit of FIG. 12 operates from an 18-volt supply connected between +terminal 20 and ground terminal 22. A 10-volt supply is coupled between +terminal 21 and ground terminal 22. As a practical matter, the 10-volt supply can be obtained from a conventional on-chip voltage regulator (not shown) operated from the 18-volt line.

Transistors 25 and 26 are operated as a differential amplifier (diff amp) driven from terminals 9 and 10. Resistors 28 and 29 act to degenerate the amplifier whose tail current $I_1$ is supplied by transistor 27. Current source 45 passes $I_2$ through transistor 44 which operates as a diode due to the coupling created by transistor 27. Resistor 30a (along with identical resistor 30b) returns the base of transistor 44 to ground and carries a current equal to $V_{BE44}$ divided by the value of resistor 30a. Resistor 31 is selected relative to the value of resistor 41 so that $I_1$ is 90% of the current in resistor 30a and $I_6$ is 110%.

The signal source coupled between terminals 9 and 10 is desirably obtained at the triangular waveform output of an oscillator of the kind disclosed in my copending application, Ser. No. 289,334, filed Aug. 3, 1981. Since this triangular waveform has a peak-to-peak amplitude of about 2 $V_{BE}$, shaper 11 will be driven well into its nonlinear response regions. Its reduced response at the signal extremes will convert the triangular input voltage into a sine waveform of signal current $I_3$ in the collector of transistor 26. By suitably selecting the values of resistors 28 and 29 along with the tail current and signal drive, a very close approximation of a sine wave form can be achieved. $I_3$ will have upper and lower peak signal values of about 99% and 1% of $I_1 = 0.9$ $V_{BE44}/R_{30a}$.

The collector current, $I_3$, of transistor 26 flows as tail current in differentially connected transistors 33 and 34. Current source 35 passes a reverse current, $I_4$, through zener diode 36, which operates in reverse breakdown, thereby, to establish a typical 7 volts at the base of transistor 34.

A current, $I_5$, flowing in the collector of transistor 37 is fed into the collector of transistor 34 and is adjusted to slightly exceed the peak value of $I_3$. The exact relationship between $I_3$ and $I_5$ is as follows. $I_5$ is scaled to 86% of $I_6$ via the unequal but accurately ratioed resistors 42 and 43 in the current mirror defined by transistors 37, 38, and 39. $I_6$ in turn is made a percentage (110%) of $V_{BE44}/R_{30a}$. Thus, $I_5 = 0.95$ $V_{BE44}/R_{30a}$. But $I_3$ is 1% to 99% of 0.9 $V_{BE44}/R_{30a}$ or about 0.01 to 0.89 $V_{BE44}/R_{30a}$. Therefore, the difference current, $I_5-I_3$, is equal to 0.06 to 0.94 $V_{BE44}/R_{30a}$ and flows through breakdown diode, 45, as drive signal current into the base of transistor 46.

It can be seen that if diodes 36 and 45 have approximately the same zener voltage, the collector of transistor 34 will always be about $V_{BE46}$ more positive than its base. This avoids any possibility of saturation in transistor 34 which acts as a signal current driver, through level shifting diode 45 to drive base signal current into transistor 46.

If transistor 46 is made to match transistor 44 and if load source 47 produces an $I_7$ value equal to that of $I_2$, the $V_{BE}$ values of the two transistors will be equal. This means that the potential at the base of transistor 46 is is the same as the potential at the base of transistor 44. Feedback forces the current, 0.06 to 0.94 $V_{BE44}/R_{30a}$, the flow through feedback resistor 48. Because 48 is made equal to 30a, the voltage dropped across this resistor is 0.06 to 0.94 $V_{BE44}$. Relative to ground (and thus across resistor 49) the potential is equal to $V_{BE44} - (0.06$ to $0.94\ V_{BE44})$ or just 0.06 to 0.94 $V_{BE44}$. Since resistor 49 is small relative to 48, the current through it is large relative to the drive signal of $I_5 - I_3$ and thus large but controlled current gain results. Feedback action causes output transistor 52 to conduct this amplified current and an output voltage proportional to load is developed in the collector of this device.

Transistor 46 is a high gain inverter which has a capacitor 50 coupled between output and input to create a current driven integrator. Such frequency compensation introduces a 6 db per octave roll off of gain with frequency and creates a stable amplifier configuration. Transistors 51 and 52 are coupled together to create a Darlington pair which drives tank circuit 15 to produce an output signal at terminals 17 and 18.

It will be noted that the Darlington pair output emitter drives resistor 49. Resistor 48 provides negative feedback to the base of transistor 46. Since the signals at the two ends of resistor 48 are equal and out of phase, it can be seen that the current gain of the amplifier that comprises transistors 46, 51, and 52 will be equal to the ratio of resistor 48 to resistor 49 plus one. With a resistor ratio of 200 and approximately 300 microamperes peak of drive signal, a signal current of 60 milliamperes peak will flow in tank 15 for driving a carrier current line signal. Since a current drive is used, a too low impedance load will have no ill effect and, if a too high impedance load is present, the signal voltage at the collector of transistor 52 will rise and actuate the automatic level control (ALC) circuit to prevent amplifier saturation and concomitant signal distortion.

The ALC operates in the following manner. For the conditions described above, the maximum signal condition is considered. Capacitor 13 was discharged so as to turn off transistor 33. It will be noted that resistor 55 couples the collector of transistor 52 (the high impedance point of tank 15) to the collector of transistor 56. It is to be understood that transistor 56 is operated in an inverted state. Its normal collector is used as an emitter and its normal emitter is used as a collector. Thus the emitter arrow as shown points in the opposite direction to the actual current flow. The base of transistor 56 is coupled to a source of reference voltage at terminal 57. Typically this reference voltage will be about 8 $V_{BE}$ above ground or at about 4.8 volts. The emitter (actually the inverted collector) of transistor 56 is coupled to dual collector transistor 58. One collector of transistor 58 is coupled back to its base so that it is simply a current mirror. If the two collectors are of equal size, the current mirror will have unity gain.

It will be noted that with the base of transistor 56 at 4.8 volts and its emitter (inverted collector) at 9.4 volts, the difference is only 4.6 volts, which is well below the zener breakdown level. Since the collector (inverted emitter) of transistor 56 is returned to the 18 volt supply via resistor 55 it can be seen that a normally connected transistor 56 could not be used because its ordinary emitter to base zener breakdown would be exceeded. The inverted connection avoids this. While an inverted transistor has a low base to collector current gain, this is not a problem with the common base connection as shown.

In operation, when the signal at the collector of transistor 52 swings below a level of about 4.2 volts, it will turn transistor 56 on and emitter current will flow in resistor 55. This current pulse will be mirrored by transistor 58 to charge capacitor 13. As capacitor 13 charges, at some point it will turn transistor 33 on and a portion of $I_3$ will be diverted away from its normal function of driving transistor 46 via transistor 34. As capacitor 13 charges, its effect will be to reduce signal drive until the signal swing at the collector of transistor 52 is just barely sufficient to keep transistor 56 on sufficiently to maintain the capacitor charge. Base and/or leakage current will normally serve to discharge capacitor 13. Thus the charge on capacitor 13 will automatically adjust the signal drive to tank 15 for a constant signal output voltage even though ambient and load conditions vary.

Zener diode 60 is coupled to the Darlington pair in such a manner as to provide a power line surge arrestor action as follows. Actually diode 60 is a combination or series string of six emitter-base diodes to give a zener breakdown of about 42 volts. If a power line surge produces a pulse voltage at the collector of over about 43 volts, zener diode 60 will start to conduct, thus turning transistor 51 and hence transistor 52 on. If transistor 52 is constructed to handle a high peak current by the use of plural emitters suitably ballasted, it will be capable of arresting a short duration power surge well within its dissipation rating. Resistor 61 is present to permit the surge arrestor action even if the transmitter is disabled.

Transistor 63 is the transmitter disable control. Its collector-emitter parallels that of transistor 46 and its base is coupled to a disable toggle terminal 64. When disable toggle terminal 64 is either low or open (in this latter case resistor 65 will pull terminal 64 low) transistor 63 will be off and the circuit will operate as previously described. However, if terminal 64 is high, transistor 63 will be conductive, thereby pulling the base of transistor 51 low or off and disabling the transmitter. However, due to the presence of resistor 61, the surge arresting capabilities of transistors 51 and 52, as described above along with zener diode 60, will be intact.

Figure 2:
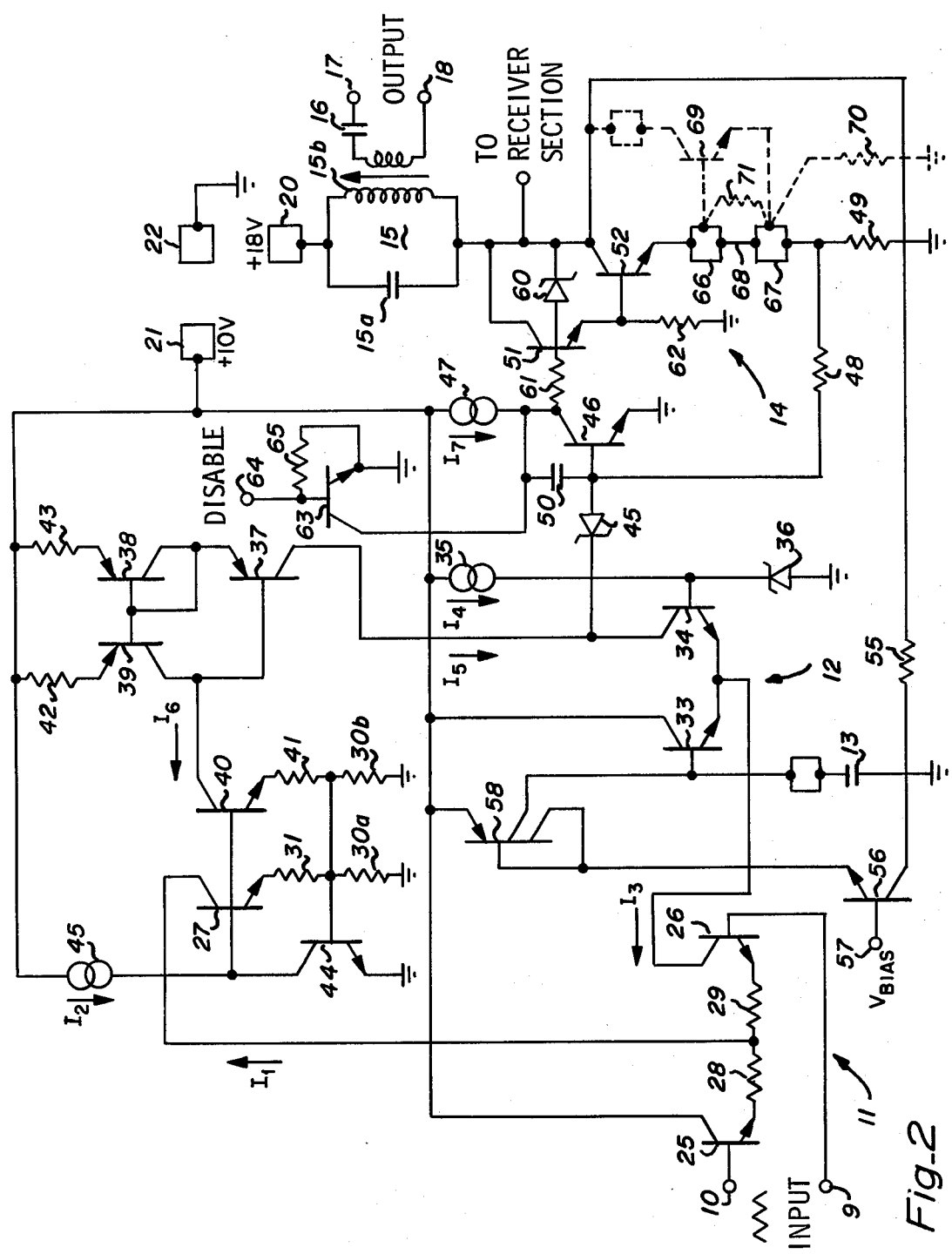
FIG. 2 is a schematic diagram of an integrated circuit form of the invention.

As pointed out above, the circuit as shown in FIG. 2 can supply about 60 ma (peak current) to tank 15 as a signal source. However, the presence of pads 66 and 67 provide a boost capability if more output is desired. Ordinarily pads 66 and 67 are strapped together by wire 68. If wire 68 is removed, an outboard transistor 69, shown in dashed outline, can be added. This device would be an NPN high power transistor preferably with a suitable heat sink mounting for high current and high power operation. When transistor 69 is coupled to the circuit, an outboard resistor 70 is added in parallel with resistor 49. This increases the ratio with resistor 48 and therefore the amplifier current gain. Base pulldown resistor 71 is also added to serve the same function that resistor 62 serves for transistor 52. Using commercially available transistors, the output current can be increased by an order of magnitude. To do this the resistance from pad 67 to ground should be reduced by a similar factor.

Whereas normally a 0.2 watt output signal is available at terminals 17 and 18, the boosted value is about 2 watts. The surge arresting capability is also enhanced with boosting but otherwise the circuit operates as explained above.

EXAMPLE

The circuit shown in FIG. 2 was fabricated in conventional monolithic silicon form using PN junction isolation. The NPN transistors were all high current gain devices using vertical construction. The PNP transistors were all of high current gain lateral construction. It will be noted that all signal amplifying stages employ only NPN transistors in order to obtain minimum signal distortion and overall best performance at 300 kHz. The following component values were employed:

| COMPONENT | VALUE | UNITS |
| --- | --- | --- |
| Capacitor 13 | 0.1 | microfarad |
| Resistors 28 and 29 | 410 | ohms |
| Resistors 30a and 30b | 2K | ohms |
| Resistor 31 | 858 | ohms |
| Current Source 35 | 300 | microamperes |
| Resistor 41 | 1045 | ohms |
| Resistor 42 | 843 | ohms |
| Resistor 43 | 1002 | ohms |
| Current Sources 45 and 47 | 300 | microamperes |
| Resistor 48 | 2K | ohms |
| Resistor 49 | 10 | ohms |
| Capacitor 50 | 20 | picofarads |
| Resistor 55 | 4K | ohms |
| Resistor 61 | 1K | ohms |
| Resistor 62 | 2K | ohms |
| Resistor 63 | 100K | ohms |

The precision values for resistors 31 and 41 are not absolute but represent a ratio that sets the values of $I_1$ and $I_6$. The same is true of resistors 42 and 43, which determine the ratio of $I_6$ to $I_5$.

A 300 kHz triangular waveform as described was coupled to terminals 9 and 10 and tank 15 was tuned to the same frequency. A 300 kHz sine wave was present at terminals 17 and 18. Without boosting (no transistor 69 or resistor 70 and jumper 68 in place) the output power was about 0.2 watt. The circuit is designed to arrest 0.5 amp line surges of over 100 volts amplitude for up to 1 ms duration.

The invention has been described and a working example detailed. When a person skilled in the art reads the foregoing description, alternatives and equivalents will become apparent. Accordingly, it is intended that the scope of the invention be limited only by the following claims.

I claim:

1. An amplifier circuit for supplying a carrier current signal to an AC power line, said circuit comprising:
    a high gain current amplifier having an input, an output and a current gain n, wherein said amplifier has one stage of phase inversion, between its input and an output thereof, a series resistor in said output and a shunt resistor coupled between said output and said input to provide negative feedback;
    an output circuit for coupling said amplifier output to said AC power line; and
    an automatic level control section responsive to the level of signal at said output and coupled to said amplifier input so that said level of signal is maintained constant.

2. The amplifier of claim 1 wherein said output circuit includes a resonant tank circuit tuned to said carrier current signal frequency.

3. The circuit of claim 1 wherein said automatic level control section is operated from an inverted NPN transistor having an emitter coupled through a current limiting resistor to said output circuit, a collector coupled to said automatic level control section, and a base coupled to a source of reference potential whereby said inverted NPN transistor is operated below its breakdown voltage.

4. The circuit of claim 1 wherein said shunt resistor is ratioed at n times the value of said series resistor thereby to determine the numerical value of said amplifier current gain.

5. The circuit of claim 1 wherein said amplifier comprises a common emitter transistor stage that is coupled to drive a Darlington amplifier that drives said output circuit and said series resistor is coupled to the emitter of said Darlington amplifier.

6. The circuit of claim 5 wherein a zener diode is coupled between said output circuit and the input of said Darlington amplifier whereby said Darlington amplifier will be turned on when line surges of said output circuit exceed the breakdown of said zener diode and said surges will be arrested.

7. The circuit of claim 6 wherein said zener diode is selected to have a breakdown voltage that is much higher than the normal operating voltage of said circuit.

8. The circuit of claim 1 further including a sine shaper input stage coupled to drive said automatic level control section, said sine shaper being capable of accepting a triangular waveform input and forming it into a sine wave shape.

9. The circuit of claim 8 wherein said sine shaper input stage comprises a pair of differentially connected transistors having degeneration resistors in the emitters thereof.

* * * * *